United States Patent [19]

Straw

[11] Patent Number: 5,877,612
[45] Date of Patent: Mar. 2, 1999

[54] AMPLIFICATION OF SIGNALS FROM HIGH IMPEDANCE SOURCES

[75] Inventor: Timothy B. Straw, Narragansett, R.I.

[73] Assignee: The United States of America as represented by the Secretary of the Navy, Washington, D.C.

[21] Appl. No.: 840,112

[22] Filed: Mar. 24, 1997

[51] Int. Cl.$^6$ .................................................. H03G 3/30
[52] U.S. Cl. .......................................... 330/254; 330/282
[58] Field of Search .................................. 330/2, 51, 69, 330/86, 254, 278–279, 282, 284

[56] References Cited

U.S. PATENT DOCUMENTS

| | | | |
|---|---|---|---|
| 4,509,021 | 4/1985 | van Uden | 330/282 |
| 4,855,685 | 8/1989 | Hochschild | 330/282 |
| 5,285,169 | 2/1994 | Theus | 330/254 |
| 5,412,346 | 5/1995 | Burger et al. | 330/86 X |

*Primary Examiner*—Steven Mottola
*Attorney, Agent, or Firm*—Michael J. McGowan; Prithvi C. Lall; William F. Eipert

[57] ABSTRACT

An analog signal conditioner for signals from high impedance sources adapted for ready implementation as an integrated circuit. The signal conditioner includes a preamplifier, a step gain amplifier and a low-pass filter. A calibration generator can inject a calibration signal into the system. The step gain amplifier includes analog switches that control paths through a voltage divider network to provide negative feedback on both sides of a fully differential operational amplifier. The design of the feedback networks minimizes the total resistance on the integrated circuit.

21 Claims, 9 Drawing Sheets

SINGLE-ENDED OUTPUT SWING

TRANSFER GAIN AND PHASE VERSUS FREQUENCY AND STEP GAIN

TRANSFER GAIN AND PHASE VERSUS FREQUENCY FOR 4 DEVICES

GAIN AND PHASE MATCHING VERSUS FREQUENCY FOR 12 DEVICES

AMPLIFICATION OF SIGNALS FROM HIGH IMPEDANCE SOURCES

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION (1) Field of the Invention

This invention generally relates to the amplification of electrical signals from a high impedance source. More specifically this invention is directed to amplification and related circuits that are particularly useful for conditioning signals from transducers with a characteristic high impedance and that are further readily and advantageously adapted for implementation in integrated circuit form.

(2) Description of the Prior Art

A variety of sensors, typically piezoelectric sensors, require high-impedance, low-noise interface circuits with amplification and other signal conditioning functions. Sonar hydrophones, piezoelectric accelerometers and pressure sensors are all examples of piezoelectric sensors characterized by a very small capacitance and thus high impedance. In essence such a piezoelectric sensor can be considered a voltage source in series with a capacitor. One application for such sensors is a high frequency beamforming acoustic array. Such an array requires very small, omni-directional acoustic sensors and miniature accelerometers which require small mass.

Initially preamplifiers for such transducers were built from discrete electrical components and often times were larger and more massive than the sensor itself. U.S. Pat. No. 4,013,992 to Dewberry et al. discloses one such preamplifier. It was found, however, that sensor performance could be degraded due to signal interaction particularly if the preamplifier were proximate the sensor. The signal interaction problems could, of course, be overcome by relocating the preamplifier a significant distance from the sensor. However, capacitance in a resulting interconnecting cable could attenuate the sensor signal and thus reduce the sensor signal-to-preamplifier noise ratio.

My U.S. Pat. No. 5,339,285 for a monolithic low noise preamplifier for piezoelectric sensors discloses a single, monolithic integrated circuit that can be mounted directly onto or inside a miniature sensor without degrading the sensor's performance. The preamplifier performs signal amplification with a fully differential amplifier that includes common-mode feedback. A pair of feedback capacitors together with the sensor capacitance control the voltage gain of the preamplifier over much of its useful operating range of 100 Hz to 100 kHz. The preamplifier circuit has feedback resistors that discharge any accumulated dc voltage which might appear on the capacitors. The feedback resistors are also components in a high pass filter that rejects low frequency background noise from the sensor.

Although such a preamplifier is particularly well adapted for implementation as an integrated circuit and is useful in a number of applications, some transducers, particularly hydrophones, can generate a signal having a wide dynamic range. This range oftentimes can generate an amplified signal that exceeds the operating range of a following analog-to-digital converter or the capabilities of other circuits. Consequently it would be desirable to employ an amplifier with variable gain, typically a step-wise variable gain, that would accommodate different portions of a total dynamic range.

Circuits providing step-wise gain generally incorporate a switched resistor network typically in a feedback circuit. For example U.S. Pat. No. 4,354,159 (1982) to Schorr et al. discloses a prescription attenuator having cascaded L-pad sections that are coupled together to form an attenuator network. In this network each cascaded section includes a single-pole switch for activating its respective section. The network impedance values are selected so that the single L-pads section activations produce actual attenuations slightly more than an ideal level of attenuation whereby multiple section activations tend to keep the error evenly distributed about an ideal level of attenuation.

U.S. Pat. No. 5,351,030 (1994) to Kobayashi et al. discloses a variable attenuator for attenuating gain of an analog signal in accordance with a digital signal. This attenuator has a plurality of attenuation resistor units, a plurality of switching units, and a plurality of impedance compensation resistor units. The attenuator resistor units are connected in series for attenuating an input signal, and the switching units are provided for the attenuation resistor units. One of the switching units is selected in accordance with a digital control signal applied from an external source. Each of the impedance compensation resistor units is connected in series with the respective switching units to compensate an output impedance to a specific value regardless of the state of the switching units. Consequently the variable attenuator in this reference can correctly control the level of an analog signal by a digital signal.

U.S. Pat. No. 5,387,879 (1995) to Satoh discloses a gain controllable output buffer amplifier circuit having a reduced circuit area. In this circuit an operational amplifier has a grounded non-inverting input and an inverting input connected through an input resistor to a signal input node. A tapped feedback resistor having a plurality of intermediate taps is connected between an output and the inverting input of the operational amplifier. Each of the intermediate taps is connected through a transistor switch in common to a non-inverting input of an output buffer amplifier, which has its output connected to a signal output node and an inverting input of the output buffer amplifier itself. The transistor switches are controlled by a switch control circuit in such a manner that only one of the transistor switches is selectively turned on.

A number of references disclose different types of circuits for operating with single-ended or differential inputs for producing differential outputs to overcome noise problems and control common mode output voltages. For example, U.S. Pat. No. 3,668,543 (1972) to Bailey discloses a transducer amplifier system; U.S. Pat. No. 4,933,644 (1990) to Fattaruso et al., a common mode feedback bias generator for operational amplifiers. U.S. Pat. No. 5,166,635 (1992) to Shih discloses a digital data line driver that receives differential input signal and generates a differential output signal. U.S. Pat. No. 5,381,112 (1995) to Rybicki et al. discloses a fully differential line driver circuit with common mode feedback; and U.S. Pat. No. 5,428,316 (1995) to Molnar, a power amplifier with quiescent current control that utilizes fully differential amplifiers and a high impedance closed loop common mode feedback control circuit.

Notwithstanding the existence of such fully differential amplifiers and the known disadvantages of operating single-ended amplifiers in applications that require the handling of large common mode voltages, such systems are still in use.

This occurs notwithstanding the fact that the operational amplifier stage gain is a function of the input common mode voltage and large common mode voltage swings can increase signal distortion. However, it has been found very difficult to implement a fully differential architecture utilizing step gain functions implemented with resistance ladder networks.

U.S. Pat. No. 4,855,685 (1989) to Hochschild discloses a precision switchable gain circuit that includes an operational amplifier operating in a differential mode. An input leg is comprised of a series resistor and a MOS transistor. A plurality of feedback legs are formed, each comprising one or more resistors that are equal in value to the input resistor and connected in series with a switch transistor. The proportion of the series resistance of the transistor in a given feedback leg to the series resistance of the transistor in the input leg is equal to the proportion of the fixed resistance in the feedback leg and input leg. The value of the series resistance of the feedback transistors therefore factors out the series resistance of the input transistor in the gain calculation resulting in reduced harmonic distortion.

Although the Hochschild patent discloses a fully differential amplifier with a step-wise gain control, the design is dependent on certain criteria that limit the application. For example, the total resistance for any given feedback leg must equal a predetermined multiple of the input resistor. Each feedback leg in most of the Hochschild embodiments is independent. There is no resistance sharing, so that the total resistance of the circuit is large. As known, the physical size of the resistors is proportional to the total resistance so increasing the total resistance increases the integrated circuit size thereby decreasing yield and increasing costs. Increasing the resistor area further increases the parasitic capacitance from the resistor to the substrate that has the effect of reducing circuit performance particularly by reducing the bandwidth over which gain is stable.

FIG. 4 of the Hochschild patent discloses a version in which resistances are shared. Although this will tend to reduce the total resistance of the circuit, the reduction occurs under only specific circumstances that limit the gain steps to integer multiples. Thus, there remains a need for a fully differential amplifier with a step-wise gain control where the gain at each step can be any arbitrary number greater than 1.

In many applications, and particularly hydrophone applications, it is also desirable to incorporate the capability of calibrating the amplifier circuit by measuring the gain of the amplifier circuit. For example, U.S. Pat. No. 4,689,578 (1987) to Spychalski discloses a hydrophone pre-amplifier with self calibration. More particularly, a differential charge amplifier design for a hydrophone preamplifier in accordance with this patent includes a calibration circuit for in situ measurement of the gain of the hydrophone amplifier and pre-amplifier. The hydrophone signal is input to a pair of amplifier stages which form a balanced differential input charge amplifier. The signal from the input charge amplifier is amplified by a second preamplifier stage and then passed to a balanced output cable driver. The calibration circuit is enabled by an external signal to inject a calibration signal into the input charge amplifier front end thereby to enable the output signal to incorporate the calibration signal in a measurable form.

FIGS. 1A and 1B depict another prior art implementation of a hydrophone preamplifier with self calibration. Although shown in detail in FIGS. 1A and 1B, it will be sufficient for the understanding of the operation of this circuit to state that a fully differential input signal appears across input connections 10A and 10B spanned by a limiting circuit 11 to drive a differential amplifier 12. The output of the differential amplifier 12 differentially drives a single-ended operational amplifier 13 generating an output at a first output terminal 14A which is coupled to a feedback circuit including an operational amplifier 15 that generates an output at a second output terminal 14B. Consequently the circuit in FIG. 1A does produce a differential output.

The circuit of FIG. 1A also includes resistors 16A and 16B that constitute calibration injection resistors that convey a fully differential calibration signal to the differential amplifier 12. FIG. 1B depicts a structure for generating the fully differential calibration signal. In this implementation a calibration input, typically a digital input signal from an external source, is applied to a terminal 20 for driving a one-bit digital-to-analog converter 21 supplied by a power supply 22. The resulting output from a common switching point 23 is fed to a precision level controller 24 that drives a two-stage amplifier section comprising operational amplifier 25 and a unit gain inverting buffer operational amplifier 26. An output selector 27 then conveys the signals from the amplifier 25 and unit gain amplifier 26 to output terminals 28A and 28B respectively. The terminals 28A and 28B connect to corresponding terminals 28A and 28B in FIG. 1A for conveying the fully differential signal from the circuit in FIG. 1B to the differential amplifier 12 in FIG. 1A. In this particular implementation, the circuitry in FIGS. 1A and 1B are separate circuits and incorporate a number of components that are not readily adapted for integrated circuit applications.

Notwithstanding the availability of fully differential, step-wise gain controlled operational amplifiers, calibration circuits and the like in the prior art, circuitry such as shown in FIGS. 1A and 1B continues to be utilized. Although the circuitry in FIG. 1A could be substituted in a single gain amplification, there still has been no solution for providing amplification of a signal having a wide dynamic range with minimal distortion. Notwithstanding the disclosure in the Hochschild patent, these and other prior approaches when implemented in an integrated circuit environment, required large values of the resistors with the previously described disadvantages. Consequently, there remains a need for a simplified design with a reduced number of components and a reduced resistance in order to optimize the construction of such an amplifier as an integrated circuit and a need for such a circuit that provides a calibration function.

SUMMARY OF THE INVENTION

Therefore it is an object of this invention to provide a selectable step gain, fully differential amplifier.

Another object of this invention is to provide a selectable step gain, fully differential amplifier that is readily and advantageously implemented utilizing integrated circuit technology.

Still another object of this invention is to provide a preamplifier for generating output signals including a calibration signal.

Still yet another object of this invention is to provide an integrated circuit including amplification circuits adapted for processing the signals from high impedance sources.

Yet another object of this invention is to provide an integrated circuit for amplifying a signal from a piezoelectric transducer.

Yet still another object of this invention is to provide an integrated circuit for amplifying a signal from a hydrophone.

Still yet another object of this invention is to provide an integrated circuit with a preamplifier and amplifier that operate in a fully differential mode, in which the amplifier provides a selectable step gain capability and wherein the integrated circuit additionally includes circuitry for calibrating the amplifier.

In accordance with one aspect of this invention, an amplifier circuit incorporates a fully differential operational amplifier having first and second balanced inputs and first and second balanced outputs to generate a balanced output signal with respect to a reference level established by a reference source. The amplifier circuit additionally includes first and second programmable voltage divider networks, each of which includes a voltage divider connecting one of the balanced outputs and the reference source and having at least one tap. A feedback resistor connects with the balanced output and each tap. A selector selectively connects the feedback resistors to the corresponding balanced input thereby to establish one of a plurality of negative feedback paths incorporating the voltage divider and feedback resistors, the selection of a particular negative feedback path establishing the characteristic gain of the amplifier circuit.

In accordance with another aspect of this invention, a monolithic, selectable gain, analog signal conditioning unit for differential signals from a high impedance signal source comprises first terminals for receiving the differential signals from the source. A fully differential preamplifier processes the received differential signals. A step-wise selectable gain, fully differential amplifier means amplifies the signal from the preamplifier. The amplified signal appears at a second set of terminals means after being conveyed from the balanced output from the amplifier. A third set of terminals receive gain selection signals thereby to select one of the available gain settings for the amplifier.

In accordance with still another aspect of this invention, a calibration generator responds to a digital signal by generating a differential calibration signal with respect to a reference value established by a reference source. The calibration generator includes an input for receiving the digital signal and a differential output for transmitting the differential calibration signal. A voltage divider connects between voltage sources of opposite polarity and equal magnitude for generating a constant magnitude signal across one resistor in the voltage divider. A switch establishes alternate sets of paths from the voltage divider to the differential output. A control responds to the digital signal for controlling the switch thereby to alternate the paths from the voltage divider to the differential output and generate an alternating, fully differential, constant magnitude calibration signal.

BRIEF DESCRIPTION OF THE DRAWINGS

The appended claims particularly point out and distinctly claim the subject matter of this invention. The various objects, advantages and novel features of this invention will be more fully apparent from a reading of the following detailed description in conjunction with the accompanying drawings in which like reference numerals refer to like parts, and in which:

DESCRIPTION OF THE PREFERRED EMBODIMENT

Figure 1A:
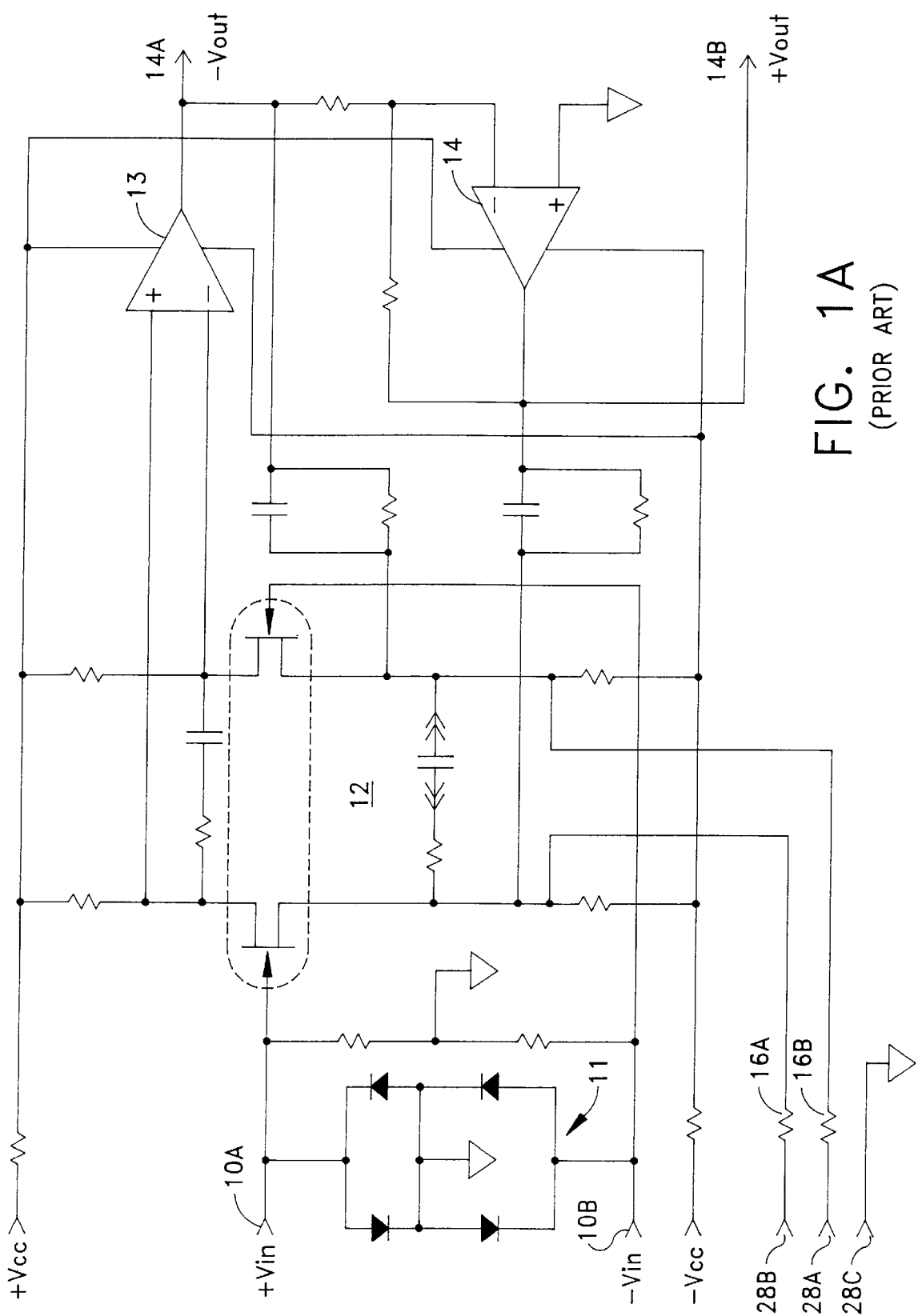
FIGS. 1A and 1B represent a prior art hydrophone signal conditioning circuit.
Figure 1B:
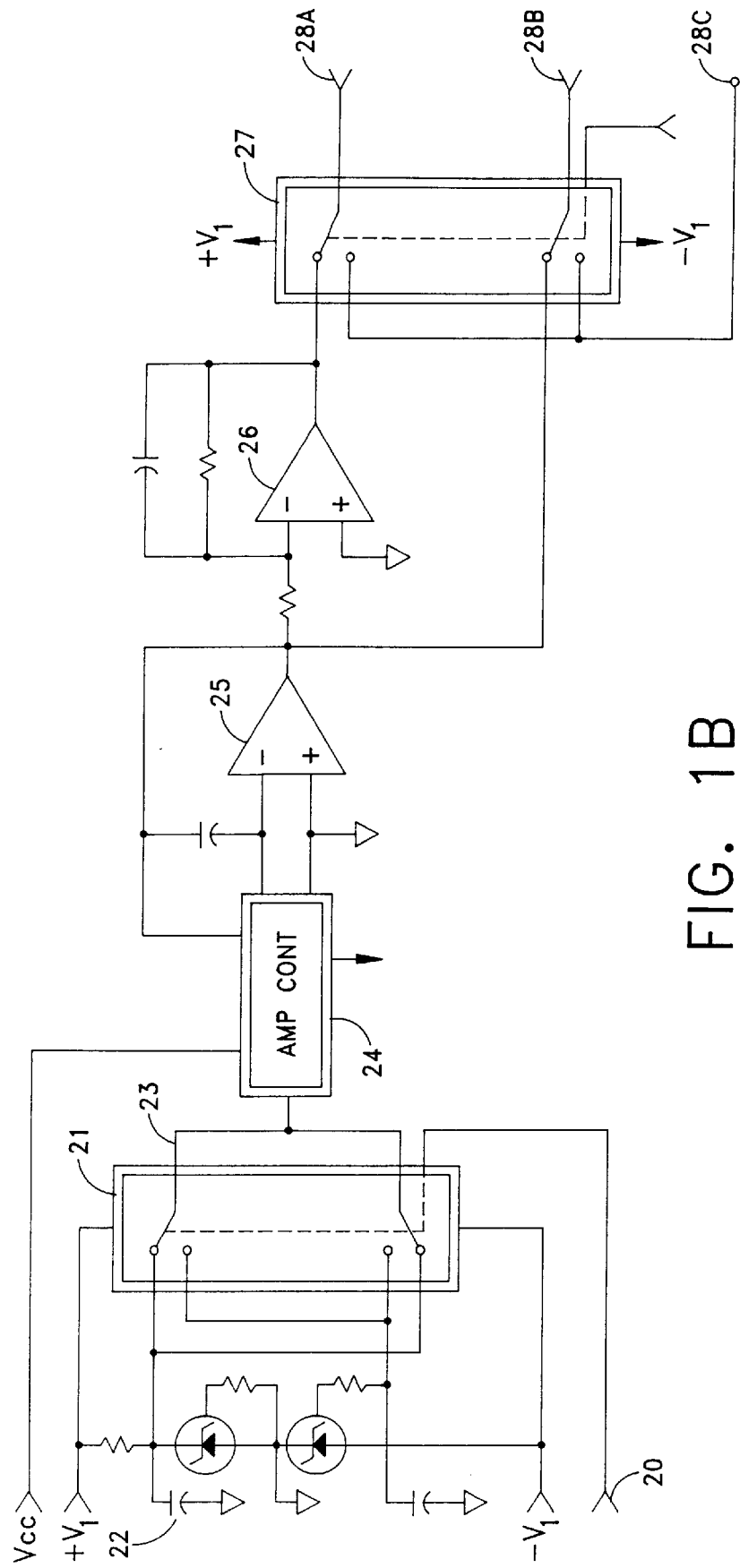
Figure 2:
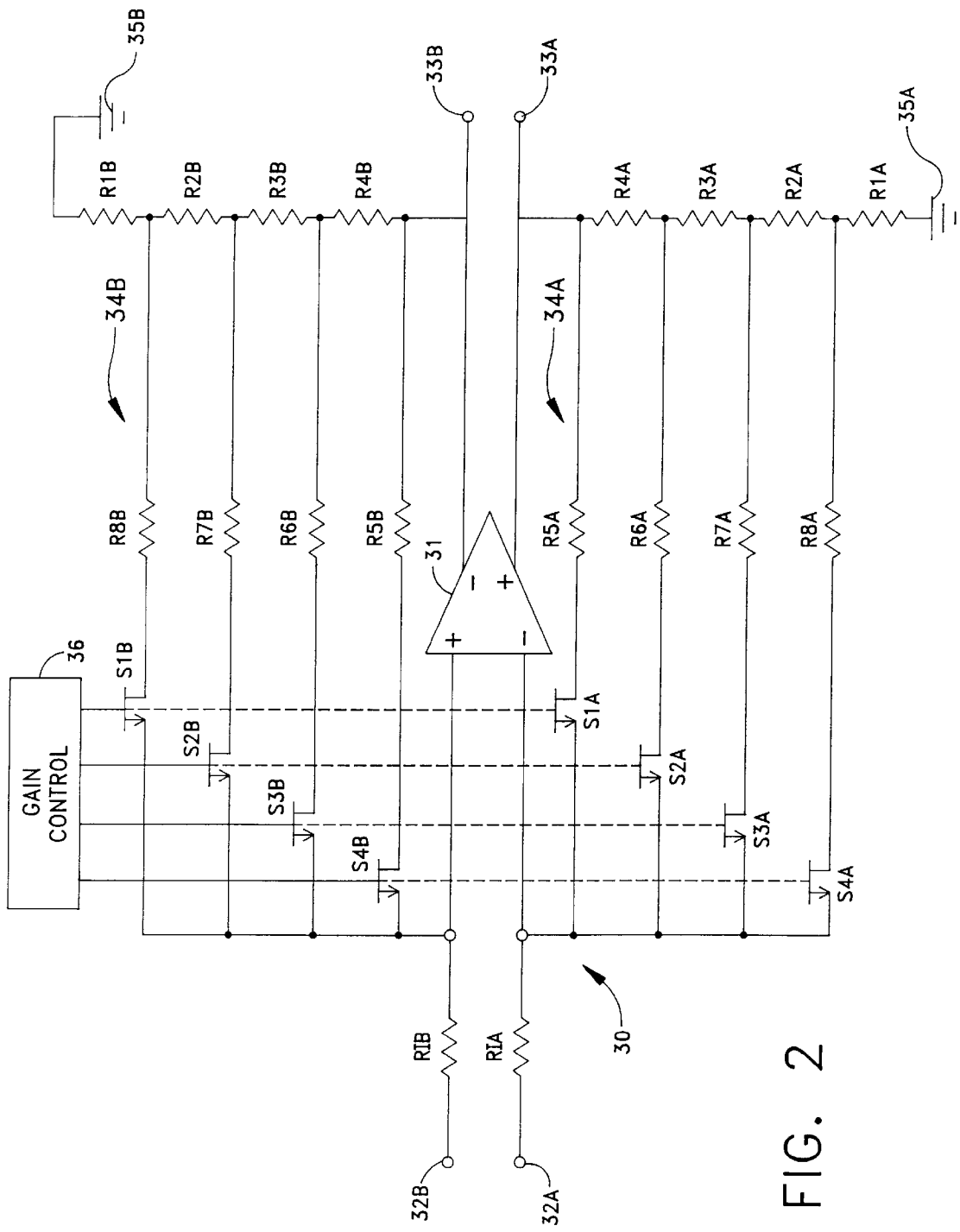
FIG. 2 is schematic of one embodiment of a selectable gain amplifier constructed in accordance with this invention.

FIG. 2 depicts a fully differential amplifier circuit characterized by step-wise selectable gain. The amplifier circuit 30 includes a differential operational amplifier 31. Input resistors RIA and RIB couple a differential input signal from input terminals 32A and 32B to the (−) and (+) balanced inputs of the operational amplifier 31. The (+) and (−) balanced outputs of the operational amplifier appear at output terminals 33A and 33B. A programmable variable voltage divider network 34A connects to the (+) output terminal 33A, the (−) input of the operational amplifier 31 and to a reference voltage or value from a reference source. In this particular embodiment the reference value is ground 35A. A corresponding programmable voltage divider 34B connects to the (−) output terminal 33B, the (+) input of the operational amplifier 31, and to a signal ground reference 35B.

A gain control circuit 36 controls conductivity through analog switches S1A through S4B in synchronism. Each set of switches such as the set S1 comprising the switches S1A and S1B, operates on a mutually exclusive basis with respect to the other sets. That is, when the switches of set S1 are conducting, the switches of sets S2, S3 and S4 are not conducting. Moreover, as each switch is enabled to conduct it establishes a path from its corresponding balanced output terminal to the input terminal.

As known, the gain of the amplifier for the closure of any one of the sets of switches is related to the proportion of the feedback resistance to the input resistance. If a step-wise gain control system is utilized, then for a predetermined number of N gain steps, there are N equations, but 2N+1 resistances for which values must be obtained. It will also become apparent that for N gain steps, N analog switches are also required in each voltage divider network. That is, in the specific example shown in FIG. 2 with four gain steps, there are four gain equations but nine resistance values namely RI and R1 through R8 and there are four analog switches for each voltage divider network. In the following discussion, the use of a reference, such as RI, is meant to refer to either of the individual corresponding elements, such as RIA or RIB.

Figure 3:
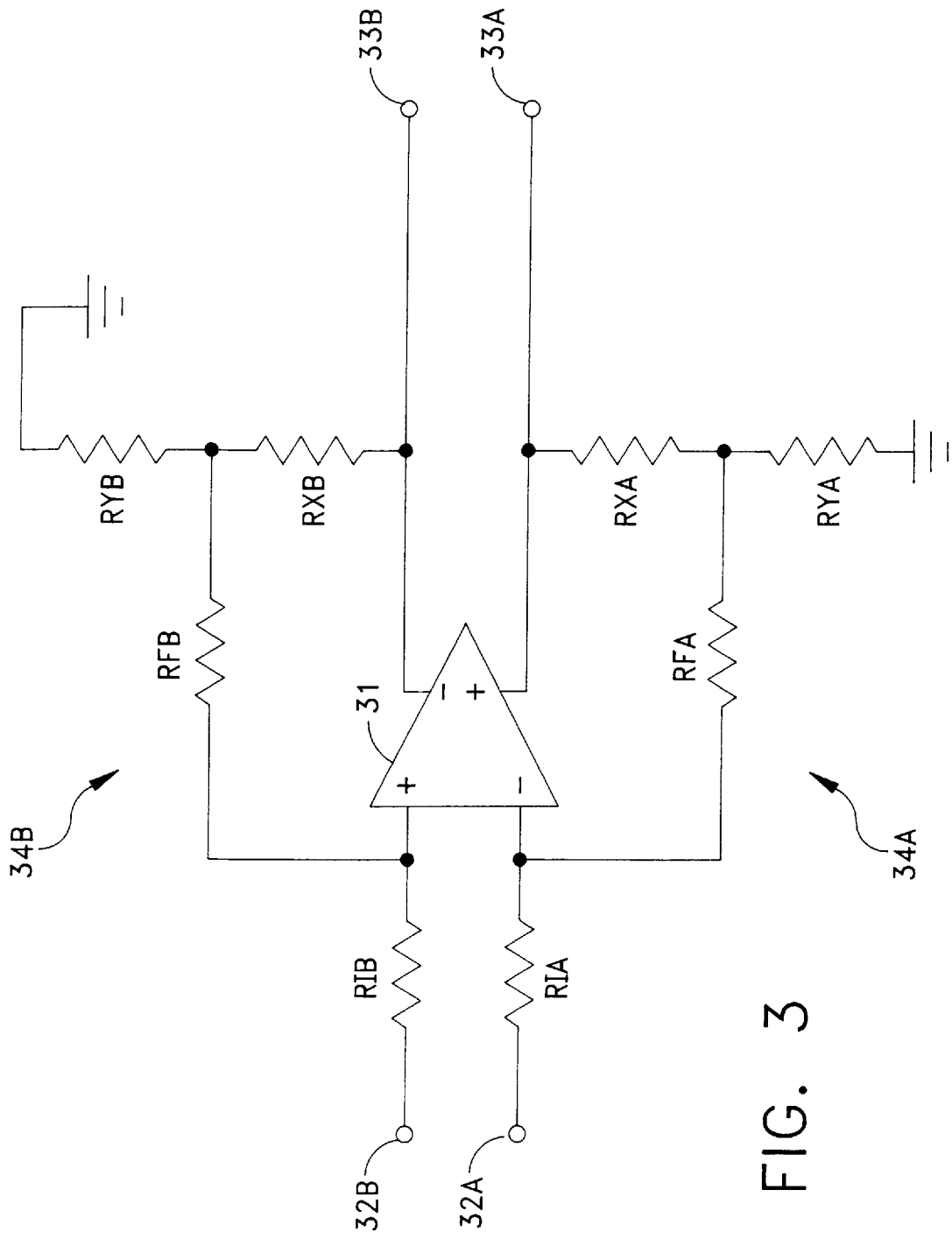
FIG. 3 is a simplified, generalized schematic of the circuit in FIG. 2 for a given gain step that is useful in understanding the theory of this invention.

FIG. 3 depicts an equivalent or generalized circuit of FIG. 2 for a given gain step. In this case input resistors RIA and RIB connect the input terminals 32A and 32B to the operational amplifier 31. The feedback network 34A is represented by a feedback resistor RFA. A voltage divider comprising resistors RXA and RYA forms a series path between the output terminal 33A and ground. The feedback resistor RFA connects to the junction of the voltage divider resistors RXA and RYA. Looking at this schematic and applying linear circuit analysis techniques, it can be shown that:

$$A_v = \left| \frac{Vout}{Vin} \right| = \frac{RF}{RI} \left( \frac{RX+RY}{RX} \right) + \frac{RY}{RI} \quad (1)$$

For the circuit in FIG. 2 it would be possible to generate four corresponding equations for utilizing different required gains. However, unless additional assumptions were made, the number of unknown resistance values will exceed the number of equations. In accordance with this invention, however, it is assumed that the resistor RX is equal to the value of the resistor RI divided by the desired voltage gain Av. Applying this to the specific circuit shown in FIG. 2, the values of R1 through R4 can then be determined as ratios of RI according to:

$$R1 = \frac{RI}{Av_4} \quad (2)$$

$$R2 = \frac{RI}{Av_3} - R1 \quad (3)$$

$$R3 = \frac{RI}{Av_2} - R2 - R1 \quad (4)$$

and $$R4 = \frac{RI}{Av_1} - R3 - R2 - R1 \quad (5)$$

For resistors R2 through Ri, equations (3) through (5) can be generalized as:

$$Rk = \frac{RI}{Av_{N-k+1}} - \sum_{i=1}^{k-1} Ri \quad (6)$$

for $2 \leq k \leq N$.

For a gain of 1 (i.e., $Av_1=1$), by inspection:

$$R1+R2+R3+R4=RI. \quad (7)$$

From FIG. 3, however, $$R1+R2+R3+R4=RX+RY. \quad (8)$$

Consequently, $$RX+RY=RI. \quad (9)$$

If the assumption $$RX = \frac{RI}{Av} \quad (10)$$

is combined with equation (9) into equation (1) and equation (1) is then solved for the value RF, the following relationship results:

$$RF_n = RI \left( 1 - \frac{1}{Av_n} + \frac{1}{Av_n^2} \right) \quad (11)$$

$1 \leq n \leq N$.

The relationships of equations (2), (6) and (11) allow the selection of specific resistors for each of the identical voltage divider networks in a straightforward manner. First, the specific gain at individual steps is determined. Second, the input resistance value is selected that is based upon particular constraints for a particular design or application. The selection of the value of the input resistance is a step that is well known in the art. With this information it is possible to determine the values for the resistances RX and RY in FIG. 3 and the resistances R1 through R4 in the specific embodiment of FIG. 2. With this information it is then possible to utilize equation (11) to determine the feedback resistance values, namely the value of the resistance RF in FIG. 3 and specifically the values of the resistances R5 through R8 in FIG. 2. Again, the value of any of the specific resistances is applied to both sides of the circuit so that once the value of R1 is obtained, R1A=R1B=R1.

By inspection it will also now be apparent that the gain steps do not have to maintain any particular relationship to each other. Typically they will. For example, four step gain functions of 1, 2, 4, 8 will provide 6 db voltage range steps. Gains of 1, 1.414, 2, 2.828, etc. will provide 3 db per step. Gains of 1, 1.059, 1.122, 1.189, etc. will correspond to 0.5 db per step. However, whatever arbitrary series of gain steps is selected, the foregoing process will yield a set of resistances that will provide the appropriate input resistance and values of the other resistors in the programmable voltage feedback network. It will also be apparent that some implementations may not require a unity gain step. In such situations the foregoing solution requires the incorporation of an additional virtual feedback leg having a gain of 1 in order to solve the equations properly.

A specific example will illustrate some of the advantages of this invention. Assume for a particular application that the input resistance is to be 44.8 kilohms; that is, RI=44.8 Kohm. Further assume that the amplifier in FIG. 2 is to provide gains of 1, 2, 4, 8 such that $Av_1=1$, $Av_2=2$, $Av_3=4$ and $Av_4=8$. According to equations (2) through (5), $$R1 = \frac{RI}{Av_4} = \frac{44.8}{8} = 5.6 \text{ Kohm} \quad (12)$$

$$R2 = \frac{RI}{Av_3} - R1 = \frac{44.8}{4} - 5.6 = 5.6 \text{ Kohm} \quad (13)$$

$$R3 = \frac{RI}{Av_2} - R1 - R2 = \frac{44.8}{2} - 5.6 - 5.6 = 11.2 \text{ Kohm} \quad (14)$$

$$R4 = \frac{RI}{Av_1} - R1 - R2 - R3 = 44.8 - 5.6 - 5.6 - 11.2 = 22.4 \text{ Kohm} \quad (15)$$

For each of the resistors R5 through R6, equation (11) is solved as follows:

For activating the switch S1 where $Av_1=1$:

$$R5 = RI \left( 1 - \frac{1}{Av_1} + \frac{1}{Av_1^2} \right) = 44.8 \left( 1 - \frac{1}{1} + \frac{1}{1^2} \right) = 44.8 \quad (16)$$

For S2 where $Av_2=2$:

$$R6 = RI \left( 1 - \frac{1}{Av_2} + \frac{1}{Av_2^2} \right) = 44.8 \left( 1 - \frac{1}{2} + \frac{1}{4} \right) = 33.6 \text{ Kohm} \quad (17)$$

Likewise for activation of S3 and S4 where $Av_3=4$ and $Av_4=8$ respectively, the values R7 and R8 are given by R7=36.4 Kohm and R8=39.9 Kohm.

As will be apparent, there is no requirement in these equations that limits the steps to any particular multiples of any resistance and no requirement that resistors have any predetermined relationship to any other resistors. Moreover from the standpoint of implementation in an integrated circuit, the corresponding circuit according to the Hochschild reference above would require a total resistance on the integrated circuit of 1433.6 Kohm. The total resistance required for the circuit of FIG. 2 is 488.6 Kohm or approximately ⅓ the resistance value. This provides a significant improvement in terms of reduction of physical size and parasitic capacitance.

Figure 4:
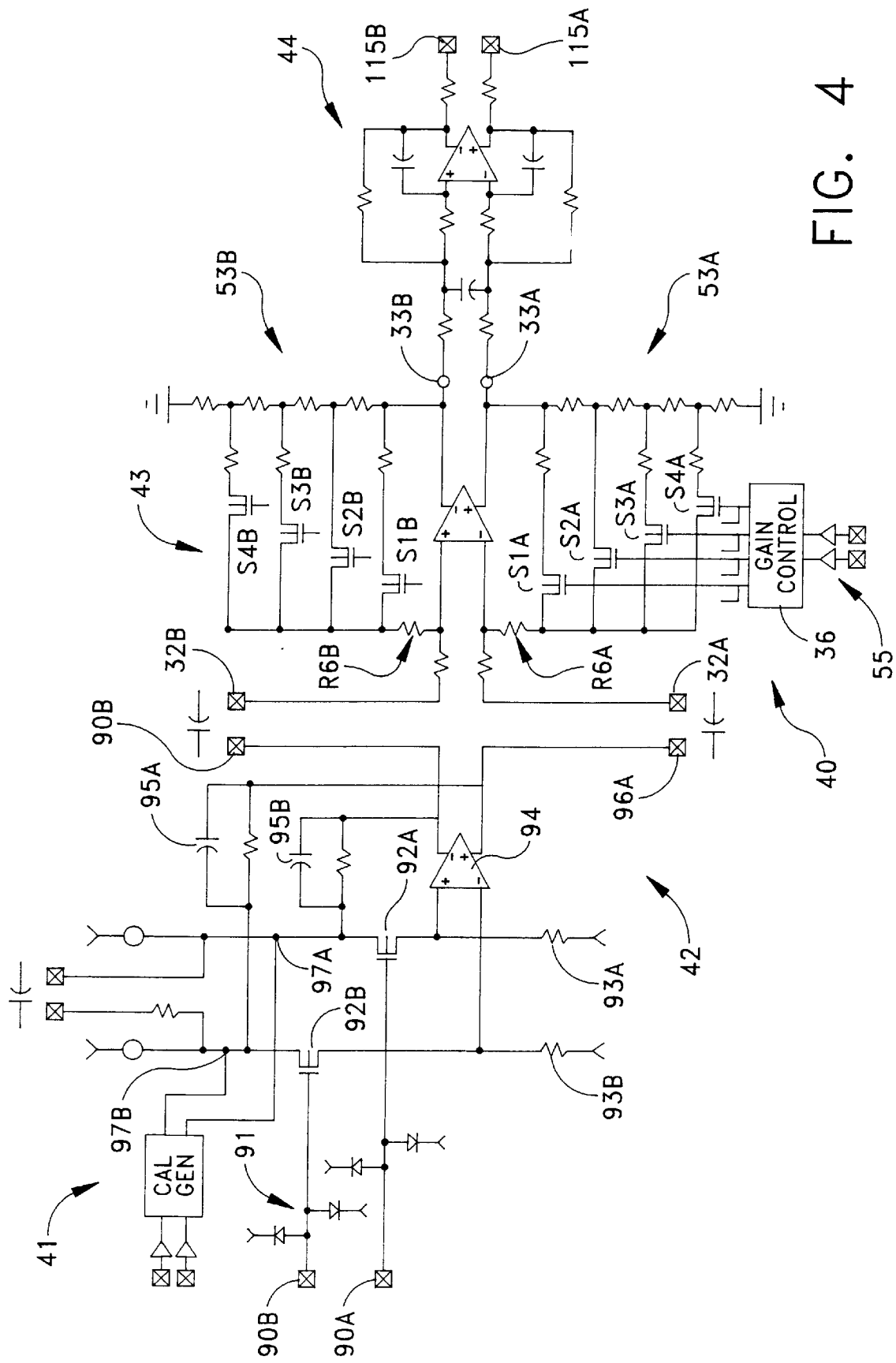
FIG. 4 a schematic of an analog signal conditioner constructed in accordance with various aspects of this invention that includes an alternate embodiment of the selectable gain amplifier shown in FIG. 2.

FIG. 4 depicts a monolithic analog signal conditioner 40 having a calibration generator 41, a fully differential preamplifier 42, a step gain fully differential amplifier 43 and a low pass filter 44. The step gain amplifier 43 produces a differential output signal at output terminals 33A and 33B for transfer to the low pass filter 44.

Using the same reference numerals as used in FIGS. 2 and 3, a first programmable voltage divider 53A provides a negative feedback path from the balanced output 33A to the balanced (−) input of the operational amplifier 31. Likewise a second programmably variable voltage divider 53B provides a negative feedback path from the balanced output 33B to the balanced (+) input of the operational amplifier. Both the voltage dividers 53A and 53B connect to the gain control 36 that responds to G0 and G1 step gain selection signals at terminals 55 to select from one of four gain steps. The gain control 36, as previously described, produces one of four outputs that is routed to corresponding switching devices within each of the programmably variable voltage dividers 53A and 53B.

FIG. 4 additionally depicts a configuration of the amplifier 43 that reduces the total resistance associated for the differential operational amplifier 31, for the same input resistance and gain pattern as disclosed in FIG. 2. More specifically, analysis of the resistors R5 through R8 in FIG. 2 demonstrates that the R6 resistance is a minimal resistance. Thus in FIG. 4 a resistor having the value of the R6 resistance and shown as R6B and R6A in FIG. 4 is connected to each of the (+) and (−) inputs of the operational amplifier 31 and a common point for each of the legs in the voltage dividers 53A and 53B respectively. As a result, the legs with the S2A and S2B switches contain no additional resistance while the resistors in the other legs have values corresponding to the difference between the required resistance of that leg and the resistor R6. Thus for an input resistance of 44.8 Kohm, the resistors controlled by the switches S1, S3 and S4 are 11.2, 2.8 and 6.3 Kohm, respectively. This modification further reduces the total resistance from approximately 488 Kohm in FIG. 2 to 287 Kohm in FIG. 4.

Figure 5:
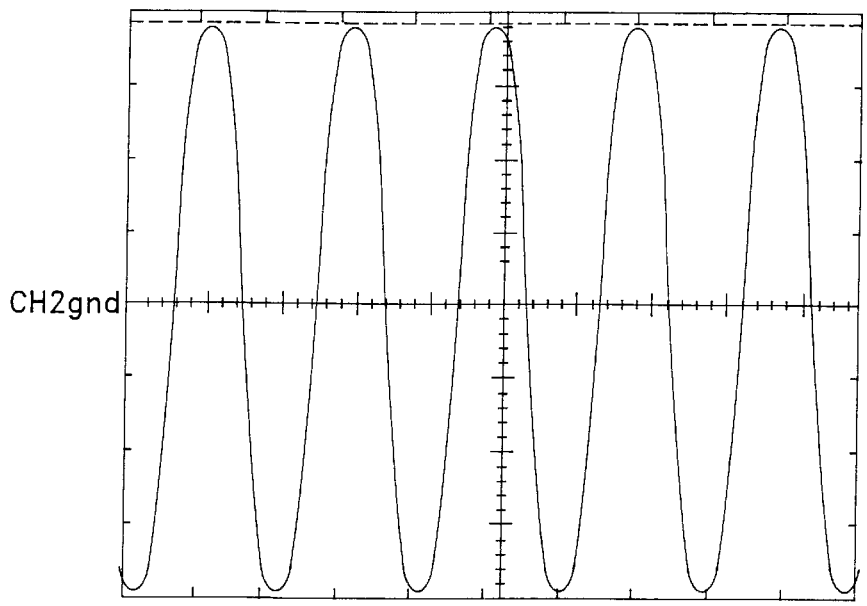
FIG. 5 is a graph of the single-ended output voltage from the circuit of FIG. 4.

FIG. 5 depicts the output at one of the output terminals 33A or 33B in FIG. 4 with respect to a reference potential or ground. This waveform has essentially no distortion, even with a peak voltage that is about 80% of the supply voltage. That is in the particular embodiment shown in FIG. 4 the peak voltage is approximately ±4 volts and the power supply voltage is ±5 volts.

Figure 6:
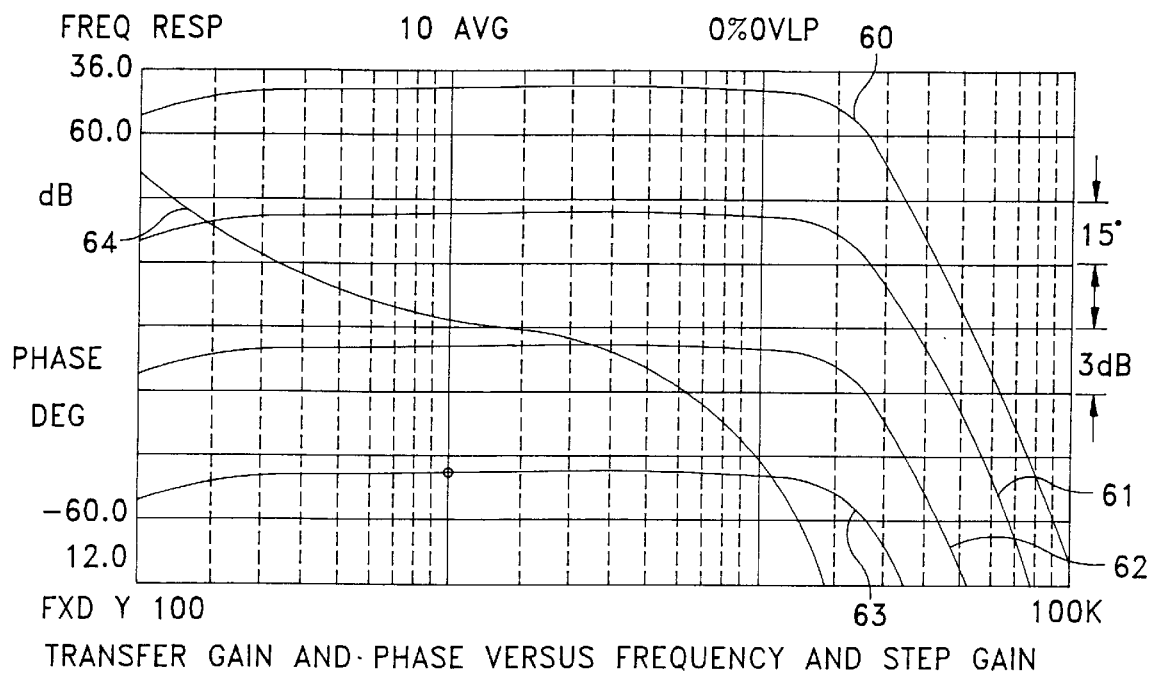
FIG. 6 is a graph that depicts transfer gain and phase characteristics of the circuit of FIG. 4.

FIG. 6 depicts the transfer gain as a function of frequency for different gain steps. For example, graph 60 represents the operations when the S4 switch is closed for maximum gain. Gain is essentially constant (i.e., ±3 db from 100 Hz through 20,000 Hz). Similar essentially constant gains occur at 6 db intervals as represented by the graph 61, 62 and 63 for each of the other positions represented by the activation of the switches S3 through S1 respectively. Graph 64 depicts phase as a function of frequency. Over the range of about 100 Hz to 20,000 Hz, the phase shift is approximately from +60° to −60°. Moreover, this single phase graph 64 represents the phase shift for each of the step-wise gain functions. That is, the graph 64 is the overlay of phase shift measurements made during the operation of each of switches S1, S2, S3 and S4. Consequently, the operation of FIG. 6 verifies the operation of the step gain amplifier 43 in FIG. 2 as providing substantially constant gain over the entire operating frequency of a hydrophone, that the steps are as predicted and that any phase shift through the network is independent of the selected gain.

Figure 7:
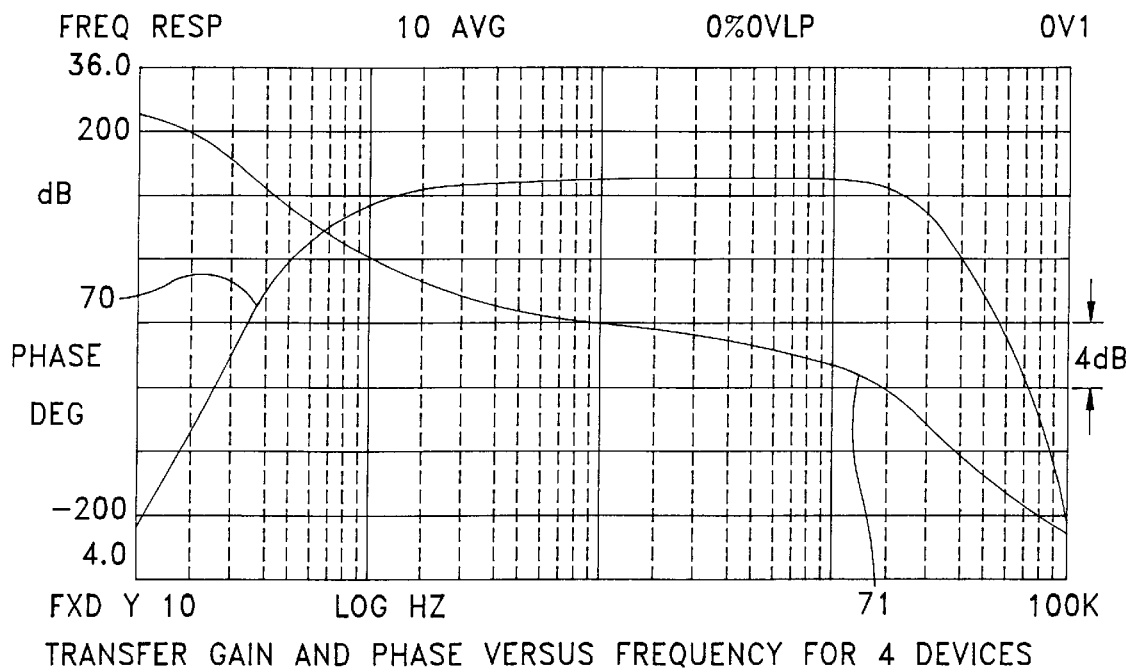
FIG. 7 is a graph that depicts transfer gain and phase characteristics for multiple circuits of FIG. 4.

FIG. 7 depicts the transfer gain and phase versus frequency for four different devices constructed as shown in FIG. 4. The gain is essentially constant over the range from 100 Hz to 20,000 Hz, as depicted by graph 70. Moreover there is essentially no variation in the characteristic gain from device to device, as the graph 70 represents the super positioning of individual measurements from each of the four separate devices. Likewise graph 71 illustrates the consistency of any phase shift over the operating range again from about +60° to −60° over a 100 Hz to 20,000 Hz range.

Figure 8:
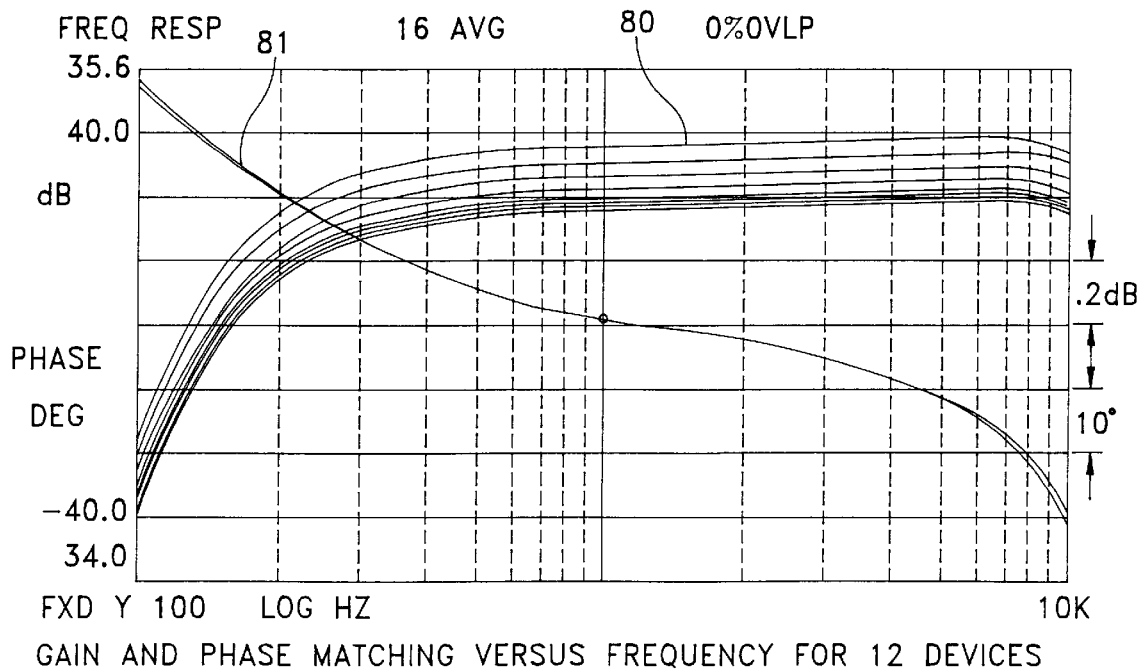
FIG. 8 is enlarged view of transfer gain and phase characteristics for multiple circuits of FIG. 4.

The repeatability of integrated circuits constructed utilizing this circuit is further demonstrated by FIG. 8 that depicts the gain in 0.2 db per division and the phase shift in 10° per division. A set of graphs 80 represent the traces of the transfer gain over the range from 100 Hz to 10,000 Hz for 12 devices. These plots demonstrate that the total gain variation is in the order of 0.2 db. Likewise the phase shift depicted by graph 81 illustrates essentially at most a 2° phase shift variation from device to device over the 12-device sample. Consequently, FIGS. 6 through 8 demonstrate that an integrated circuit device utilizing the step gain amplifier of this invention has predictable and repeatable performance characteristics.

Referring again to FIG. 4, the calibration generator 41 and preamplifier 42 provide a differential input to the input terminals 32A and 32B. The preamplifier 42 receives the incoming signal from a hydrophone or other sensor at input terminals 90B and 90A. Voltage limiting diodes 91 limit the incoming voltage to their respective forward diode voltage drops. Each of the inputs 90A and 90B drives a corresponding one of input amplification transistors 92A and 92B, respectively, that control current flow through resistors 93A and 93B thereby to develop dual input into a fully differential operational amplifier 94 that contains conventional negative feedback circuits 95A and 95B. The resulting output signals from the differential preamplifier 42 are also coupled to the step gain amplifier 43 either internally, or as shown in FIG. 4, through a capacitive coupling between output terminal 96B and input terminal 30B and between output terminal 96A and input terminal 32A.

Figure 9:
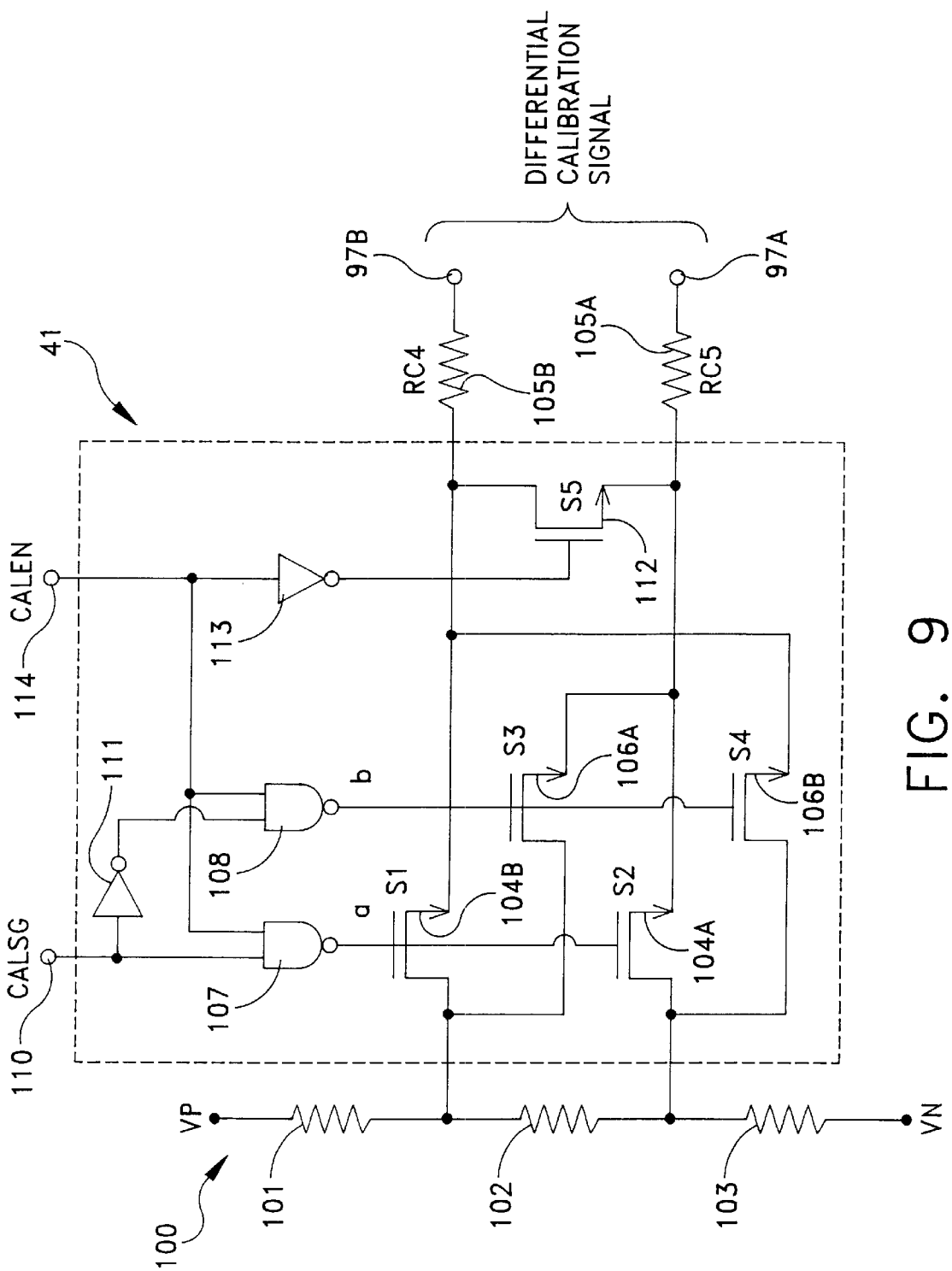
FIG. 9 is a schematic of a calibration signal generator useful in the circuit of FIG. 4.

In accordance with another aspect of this invention, the calibration generator 41 can, when enabled by a CALEN signal, inject a fully differential calibration signal into the paths controlled by the input amplification transistors 92A and 92B thereby to be input into the operational amplifier 94. It has been found that a simple calibration circuit can be incorporated that is readily adapted for integrated circuit design. More particularly the calibration generator 41, as shown in FIG. 9, includes a voltage divider 100 comprising a series of resistors 101 through 103. Resistor 101 connects to a positive supply and resistor 103, having the same resistance as resistor 101, to a negative supply represented as terminals VP and VN respectively. This develops a differential signal across the intermediate series resistor 102 with respect to ground as a reference value.

An analog switch 104B, when enabled, establishes a path for the signal through an output resistor 105B to the terminal 97B. Likewise an analog switch such as a MOS transistor 104A establishes a path through an output resistor 105A to the terminal 97A. When the switches 104A and 104B do not conduct, another switch 106A couples the signal from the input of the switch 104B to the resistor 105A while a fourth analog switch 106B couples the signals at the input of the switch 104A to the resistor 105B.

Switches 104A and 104B and 106A and 106B are controlled by a logic network comprising NAND gates 107 and 108. The CALEN calibration enabling signal, when asserted or at an enabling level, enables both the NAND gates 107 and 108. During this interval a digital signal pattern applied from an external source as a CALSG signal to the terminal 110 is applied directly to the NAND gate 107 and through an inverter 111 to the NAND gate 108. Consequently when the CALSG signal is at an assertive or positive level, the output of the NAND gate 108 will bias the switches 106A and 106B to conduct while the NAND gate 107 will bias the switches 104A and 104B to a non-conductive state. Consequently the voltage across the resistor 102 will be transferred through the resistors 105A and 105B and, in this case, the output terminal 97A will be positive with respect to the output terminal 97B. When the CALSG signal reverts to a non-asserted level, the switching reverses so the signal across the resistor 102 passes through the gates 104A and 104B and the terminal 97B will be positive with respect to the terminal 97A. Moreover the signals at each of the terminals 97A and 97B will be symmetrical with respect to ground. If the CALEN enable signal is not asserted, then neither the gates 104A and 104B nor the gates 106A and 106B are conductive. When the CALEN enable signal is asserted, the input amplifying transistors 92A and 92B, that are in a common gate configuration, transfer the calibration signal into the (−) and (+) inputs of the differential operational amplifier 94 thereby to sum the signal from the transducer and the calibration signal.

To further assure proper operation of the circuit and to increase the isolation between the signals from the calibration generator 41 and the transducer, the circuit in FIG. 9 includes another analog switch 112 coupled between high impedance resistors 105A and 105B on the side opposite from the terminals 97A and 97B. When a CALEN signal is asserted, an inverter 113 shifts the switch 112 to a non-conductive state so calibration injection occurs. However, when the CALEN enable signal is not asserted or is at a disabling level, the inverter 113 causes the switch 112 to conduct and essentially short the resistors 105A and 105B to produce a high impedance series circuit or load across the input that has essentially no effect on the incoming transducer signal.

The construction of the calibration circuit 41, preamplifier circuit 42 and step gain amplifier circuit 43 are simple to implement on a standard integrated circuit so there is room on a standard circuit for other circuits. This enables an active low-pass filter 44 of conventional construction to be added to the integrated circuit. Thus any high frequency signals that might be generated and appear at the terminals 33A and 33B are blocked from output terminals 115B and 115A.

Figure 10:
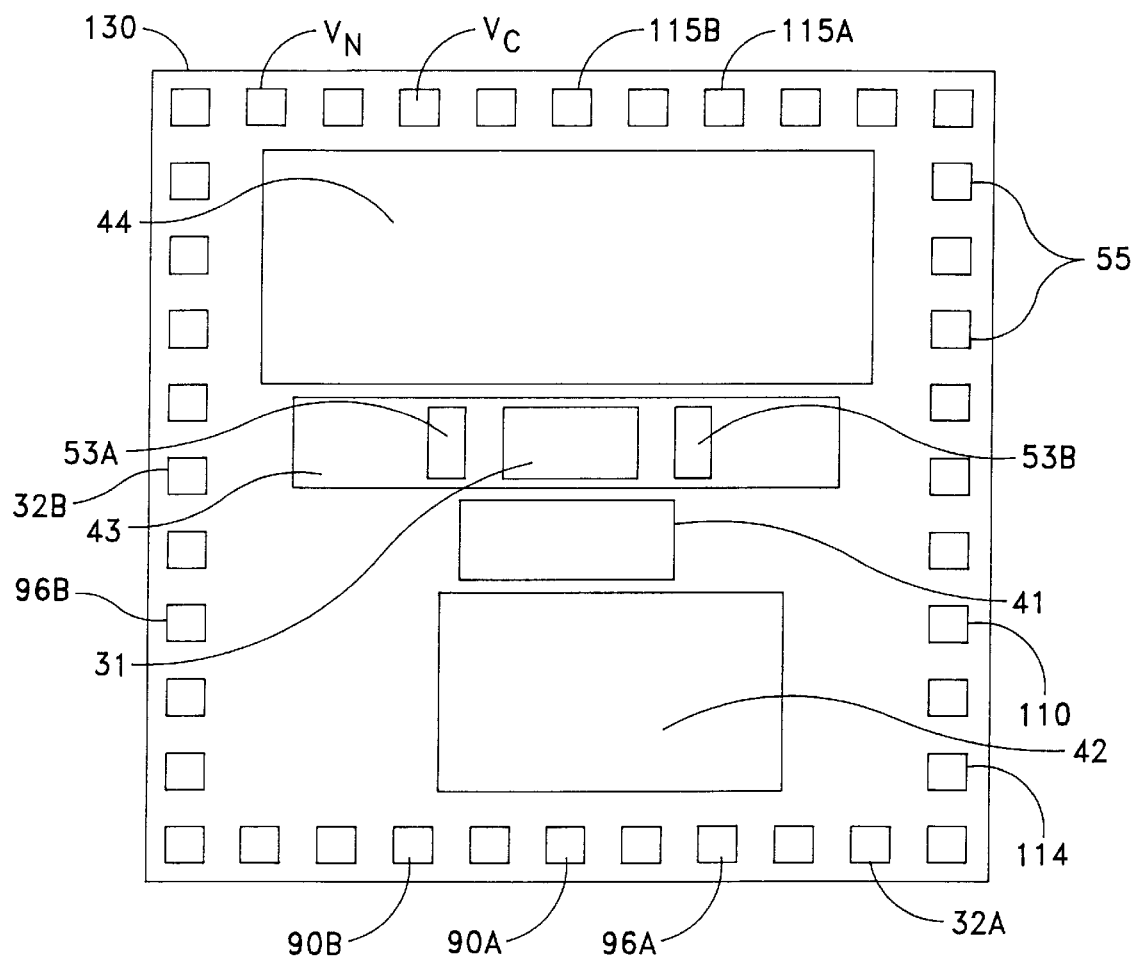
FIG. 10 depicts a typical component topology for the circuit shown in FIG. 4 on an integrated circuit.

FIG. 10 is an outline of an integrated circuit that has been constructed in accordance with this invention. It depicts the specific ones of the signals that are provided to the integrated circuit and obtained from the integrated circuit. Others will be apparent from the mnemonic assigned to a particular pad. The integrated circuit is then also divided to depict the general location or topology of the circuits. That is the circuitry associated with each of the operational amplifier 31, the calibration generator 41, preamplifier 42, step gain amplifier 43 and low-pass filter 44 are shown. In addition the positions of the resistors forming the feedback networks for the step gain amplifier 43 are also depicted by reference numerals 53A and 53B.

This invention has been disclosed in terms of certain embodiments. It will be apparent that many modifications can be made to the disclosed apparatus without departing from the invention. Therefore, it is the intent of the appended claims to cover all such variations and modifications as come within the true spirit and scope of this invention.

What is claimed is:

1. An amplifier circuit for providing a balanced output signal with respect to a reference level established by a reference source, said amplifier comprising:
    a differential operational amplifier having first and second balanced inputs and first and second balanced outputs; and
    first and second voltage divider networks, each of said voltage divider networks including:
        a voltage divider connecting one of the balanced outputs and the reference source and having at least one tap;
        a feedback resistor for connection with said balanced input and each said tap; and
        means for selectively connecting the feedback resistors to the corresponding balanced input thereby to establish one of a plurality of negative feedback paths incorporating said voltage divider and feedback resistors, the selection of a particular negative feedback path establishing the characteristic gain of the amplifier circuit.

2. An amplifier circuit as recited in claim 1 additionally comprising an input resistor in series with each of said balanced inputs, each of said negative feedback paths connecting to the junction of the corresponding balanced input and input resistor.

3. An amplifier circuit as recited in claim 2 adapted for operating with a predetermined number of gain steps, each said voltage divider comprising a plurality of series resistors corresponding to the predetermined number.

4. An amplifier circuit as recited in claim 3 wherein each said selective connecting means comprises a plurality of analog switches corresponding to the predetermined number, one of said analog switches establishing a path from the corresponding balanced output terminal and the remaining switches establishing paths from individual voltage divider taps.

5. An amplifier circuit as recited in claim 4 additionally comprising means for controlling said selective connection means in each said divider network in synchronism.

6. An amplifier circuit as recited in claim 5 wherein the voltage divider networks are identical.

7. An amplifier circuit as recited in claim 5 wherein one of the feedback resistors has a minimum value and connects directly to said corresponding balanced input whereby all feedback paths incorporate said one feedback resistor, said remaining feedback resistors having incremental additive values to establish the required resistor value for each desired gain.

8. An amplifier circuit as recited in claim 3 wherein, for each corresponding balanced input and output, said input resistor has a predetermined value RI, the predetermined number of gains is n and each gain is given by $Av_n$, and the resistors in the voltage divider are R1 and R2 through Rk, given by:

$$R1 = \frac{RI}{Av_n}$$

and $$Rk = \frac{RI}{Av_{N-k+1}} - \sum_{i=1}^{k-1} Ri$$

for $2 \leq k \leq N$.

9. An amplifier circuit as recited in claim 8 wherein said feedback resistors are $RF_1$ through $RF_n$ and each feedback resistor has a value:

$$RF_n = RI\left(1 - \frac{1}{Av_n} + \frac{1}{Av_n^2}\right).$$

10. A monolithic, selectable gain, analog signal conditioning unit for differential signals from a high impedance signal source, said circuit comprising:

input terminal means for receiving a differential signal from the source;

fully differential preamplifier means connected to said input terminal means for amplifying the received differential signal;

a selectable step-wise gain, fully differential amplifier means for amplifying the signal from said preamplifier means;

means for conveying the balanced output from said amplifier means to a second terminal means; and means for selecting one of the available gain steps for said amplifier means in response to a gain selection signal.

11. A conditioning unit as recited in claim 10 additionally comprising:

calibration means for generating a balanced analog calibration signal in response to a calibration control signal; and means for combining the balanced analog calibration signal and the received differential signals for input to said preamplifier means.

12. A conditioning unit as recited in claim 10 wherein said amplifier provides a balanced output signal with respect to a reference level established by a reference source, said amplifier comprising:

a fully differential operational amplifier having first and second balanced inputs and first and second balanced outputs; and first and second programmable voltage divider networks, each of said voltage divider networks including:
- a voltage divider connecting one of the balanced outputs and the reference source and having at least one tap;
- a feedback resistor for connection with said balanced input and each said tap; and
- means for selectively connecting the feedback resistors to the corresponding balanced input thereby to establish one of a plurality of negative feedback paths incorporating said voltage divider and feedback resistors, the selection of a particular negative feedback path establishing the characteristic gain of the amplifier circuit.

13. A conditioning unit as recited in claim 12 wherein amplifier means additionally comprises an input resistor in series with each of said balanced inputs, each of said negative feedback paths connecting to the junction of the corresponding balanced input and input resistor.

14. A conditioning unit as recited in claim 13 wherein said amplifier means is adapted for operating with a predetermined number of gain characteristics, each said voltage divider comprising a plurality of series resistors corresponding to the predetermined number.

15. A conditioning unit as recited in claim 14 wherein each said selective connecting means in said amplifier means comprises a plurality of analog switches corresponding to the predetermined number, one of said analog switches establishing a path from the corresponding balanced output terminal and the remaining switches establishing paths from individual voltage divider taps.

16. A conditioning unit as recited in claim 15 wherein said amplifier means additionally comprises means for controlling said selective connection means in each said divider network in synchronism.

17. A conditioning unit as recited in claim 16 wherein the voltage divider networks in said amplifier means are identical.

18. A conditioning unit as recited in claim 15 wherein one of the feedback resistors in said amplifying means has a minimum value and connects directly to said corresponding balanced input whereby all feedback paths incorporate said one feedback resistor, said remaining feedback resistors having incremental additive values to establish the required resistor value for each desired gain.

19. A conditioning unit as recited in claim 16 wherein, for each corresponding balanced input and output of said amplifying means, said input resistor has a predetermined value RI, the predetermined number of gains is n and each gain is given by $Av_n$, and the resistors in the voltage divider are R1 and R2 through Rk, given by:

$$R1 = \frac{RI}{Av_n}$$

and $$Rk = \frac{RI}{Av_{N-k+1}} - \sum_{i=1}^{k-1} Ri$$

for $2 \leq k \leq N$.

20. A conditioning unit as recited in claim 19 wherein said feedback resistors in said amplifying means are $RF_1$ through $RF_n$ and each feedback resistor has a value:

$$RF_n = RI\left(1 - \frac{1}{Av_n} + \frac{1}{Av_n^2}\right).$$

21. A conditioning unit as recited in claim 10 wherein said conveying means comprises a low-pass active filter including a balanced operational amplifier.

* * * * *